(12) United States Patent
Oesterling et al.

(10) Patent No.: US 7,286,047 B2
(45) Date of Patent: Oct. 23, 2007

(54) TELEMATICS SYSTEM DIAGNOSTICS LOGIC ANALYZER

(75) Inventors: Christopher L. Oesterling, Troy, MI (US); Gary A. Watkins, Royal Oak, MI (US); Wanli Chiu, Troy, MI (US)

(73) Assignee: General Motors Corporation, Detroit, MI (US)

( * ) Notice: Subject to any disclaimer, the term of this patent is extended or adjusted under 35 U.S.C. 154(b) by 145 days.

(21) Appl. No.: 10/960,683

(22) Filed: Oct. 7, 2004

(65) Prior Publication Data

US 2006/0085153 A1     Apr. 20, 2006

(51) Int. Cl.
*G01M 17/00* (2006.01)
*G06F 7/00* (2006.01)
*B60R 25/10* (2006.01)

(52) U.S. Cl. .................... 340/439; 340/426.15; 401/29
(58) Field of Classification Search ................................
340/426.15–426.17, 426.23; 701/2, 36, 701/49, 29–35
See application file for complete search history.

(56) References Cited

U.S. PATENT DOCUMENTS

| 6,028,537 | A * | 2/2000 | Suman et al. ............... 340/988 |
| 6,265,988 | B1 * | 7/2001 | LeMense et al. ...... 340/825.69 |
| 6,415,210 | B2 * | 7/2002 | Hozuka et al. ............... 701/29 |
| 2005/0156715 | A1 * | 7/2005 | Zou et al. .............. 340/426.19 |

OTHER PUBLICATIONS

Christopher Oesterling et al.; U.S. Appl. No. 11/024,103, filed Dec. 28, 2004.

* cited by examiner

*Primary Examiner*—Benjamin C. Lee
*Assistant Examiner*—Jennifer Mehmood (57) ABSTRACT

A method of monitoring electronic module data in a mobile vehicle. The method includes receiving at least one trigger event status indicator responsive to a trigger set from at least one of a plurality of vehicles at a vehicle analysis engine, via a wireless network, modifying the trigger set based on the trigger event status indicators and sending the modified trigger set to the plurality of vehicles.

20 Claims, 5 Drawing Sheets

TELEMATICS SYSTEM DIAGNOSTICS LOGIC ANALYZER

FIELD OF THE INVENTION

This invention relates generally to a telematics system diagnostic logic analyzer. In particular, the invention relates to a method, system and computer usable medium for monitoring electronic module data in a mobile vehicle to provide and update preventative diagnostic algorithms.

BACKGROUND OF THE INVENTION

The opportunity to personalize features in a mobile vehicle is ever increasing as the automobile is being transformed into a communications and entertainment platform as well as a transportation platform. Many new cars will be installed with some type of telematics unit to provide wireless communication and location-based services. These services may be accessed through interfaces such as voice-recognition computer applications, touch-screen computer displays, computer keyboards, or a series of buttons on the dashboard or console of a vehicle.

Some telematics units monitor for diagnostic trouble codes in the vehicle. Diagnostic trouble codes are formed from sensory inputs from various electronic modules in the vehicle. This diagnostic trouble code input is provided to a vehicle after a critical point has been passed and the vehicle requires some adjustments or service to correct the problem. The information provided relates to a troubled vehicle system after the problem occurs and not before the trouble starts.

It is desirable, therefore, to provide a method, system and computer usable medium that transmits status indicators, which are based on trigger sets in the telematics units of vehicles with like electronic modules, to a vehicle analysis engine. It is desirable for the vehicle analysis engine to monitor the status indicators and trends in the status indicators to anticipate impending problems for the vehicles with like electronic modules and to communicate that potential problem to a user and/or a vehicle service center. It is also desirable to provide a method, system and computer usable medium for the vehicle analysis engine to dynamically modify the trigger sets for vehicles, which share like electronic modules, as the vehicle analysis engine analysis recognizes trends in the vehicle's status.

SUMMARY OF THE INVENTION

One aspect of the present invention provides a method of monitoring electronic module data in a mobile vehicle. The method includes receiving, via a wireless network, at least one trigger event status indicator responsive to a trigger set from at least one of a plurality of vehicles at a vehicle analysis engine, modifying the trigger set based on the trigger event status indicators and sending the modified trigger set to the plurality of vehicles.

Another aspect of the present invention provides a system to monitor electronic module data in a mobile vehicle. The system includes means to receive, via a wireless network, at least one trigger event status indicator responsive to a trigger set, means to modify the trigger set based on the trigger event status indicators and means to send the modified trigger set to the plurality of vehicles.

A third aspect of the present invention provides computer readable medium storing a computer program including computer readable code operable to receive, via a wireless network, at least one trigger event status indicator responsive to a trigger set from at least one of a plurality of vehicles at a vehicle analysis engine, to modify the trigger set based on the trigger event status indicators and to send the modified trigger set to the plurality of vehicles.

The foregoing and other features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

BRIEF DESCRIPTION OF THE DRAWINGS

Various embodiments of the present invention are illustrated by the accompanying figures, wherein.

DETAILED DESCRIPTION OF THE PRESENTLY PREFERRED EMBODIMENTS

Figure 1:
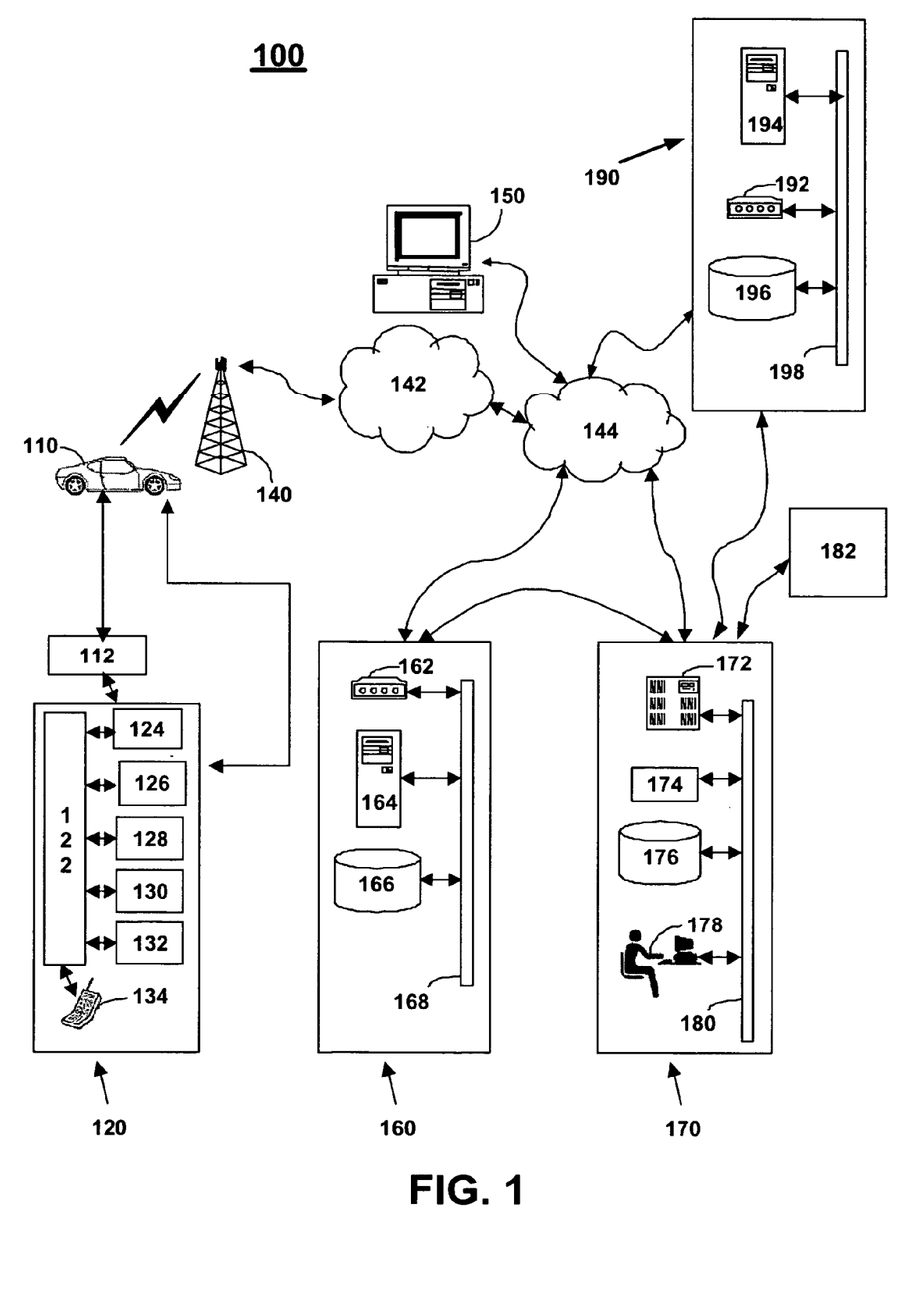
FIG. 1 illustrates one embodiment of system for data transmission over a wireless communication system, in accordance with the present invention.

FIG. 1 illustrates one embodiment of system for data transmission over a wireless communication system, in accordance with the present invention at 100. Mobile vehicle communication system (MVCS) 100 includes a mobile vehicle communication unit (MVCU) 110, a vehicle communication network 112, a telematics unit 120, one or more wireless carrier systems 140, one or more communication networks 142, one or more land networks 144, one or more client, personal or user computers 150, one or more web-hosting portals 160, and one or more call centers 170. In one embodiment, MVCU 110 is implemented as a mobile vehicle equipped with suitable hardware and software for transmitting and receiving voice and data communications. MVCS 100 may include additional components not relevant to the present discussion. Mobile vehicle communication systems and telematics units are known in the art.

MVCU 110 may also be referred to as a mobile vehicle throughout the discussion below. In operation, MVCU 110 may be implemented as a motor vehicle, a marine vehicle, or as an aircraft. MVCU 110 includes electronic modules (not shown) attached to the vehicle communication network 112. Some electronic modules include the Power train Control Module (PCM), Antilock Brakes System (ABS) and Instrument Panel Cluster (IPC). MVCU 110 may include additional components not relevant to the present discussion.

Vehicle communication network 112 exchanges signals between various units of equipment and systems (detailed below) within MVCU 110 to perform various functions such as unlocking a door, opening the trunk, setting personal comfort settings, and calling from telematics unit 120. In facilitating interactions among the various communication and electronic modules, vehicle communication network 112 utilizes network interfaces such as controller-area network (CAN), International Organization for Standardization (ISO) Standard 9141, ISO Standard 11898 for high-speed applications, ISO Standard 11519 for lower speed applications, and Society of Automotive Engineers (SAE) Standard J1850 for high-speed and lower speed applications.

MVCU 110, via telematics unit 120, sends and receives radio transmissions from wireless carrier system 140. Wireless carrier system 140 is implemented as any suitable system for transmitting a signal from MVCU 110 to communication network 142.

Telematics unit 120 includes a processor 122 connected to a wireless modem 124, a global positioning system (GPS) unit 126, an in-vehicle memory 128, a microphone 130, one or more speakers 132, and an embedded or in-vehicle mobile phone 134. In other embodiments, telematics unit 120 may be implemented without one or more of the above listed components, such as, for example GPS unit 126 or speakers 132. Telematics unit 120 may include additional components not relevant to the present discussion.

Processor 122 is, for example, implemented as a microcontroller, microprocessor, controller, host processor, or vehicle communications processor. In an example, processor 122 is implemented as an application specific integrated circuit (ASIC). In one embodiment, processor 122 is a digital signal processor (DSP). In another embodiment, processor 122 is implemented as a processor working in conjunction with a central processing unit (CPU) performing the function of a general-purpose processor. GPS unit 126 provides longitude and latitude coordinates of the vehicle responsive to a GPS broadcast signal received from one or more GPS satellite broadcast systems (not shown). In-vehicle mobile phone 134 is a cellular-type phone, such as, for example an analog, digital, dual-mode, dual-band, multi-mode or multi-band cellular phone.

Processor 122 executes various computer programs that control programming and operational modes of electronic and mechanical systems within MVCU 110. Processor 122 controls communications (e.g. call signals) between telematics unit 120, wireless carrier system 140, and call center 170. In one embodiment, a voice-recognition application is installed in processor 122 that can translate human voice input through microphone 130 to digital signals. Processor 122 generates and accepts digital signals transmitted between telematics unit 120 and vehicle communication network 112. In one embodiment, these digital signals activate the programming mode and operation modes, as well as provide for data transfers. In this embodiment, signals from processor 122 are translated into voice messages and sent out through speaker 132.

Communication network 142 includes services from one or more mobile telephone switching offices and wireless networks. Communication network 142 connects wireless carrier system 140 to land network 144. Communication network 142 is implemented as any suitable system or collection of systems for connecting wireless carrier system 140 to MVCU 110 and land network 144.

Land network 144 connects communication network 142 to client computer 150, web-hosting portal 160, and call center 170. In one embodiment, land network 144 is a public-switched telephone network (PSTN). In another embodiment, land network 144 is implemented as an Internet protocol (IP) network. In other embodiments, land network 144 is implemented as a wired network, an optical network, a fiber network, other wireless networks, or any combination thereof. Land network 144 is connected to one or more landline telephones. Communication network 142 and land network 144 connect wireless carrier system 140 to web-hosting portal 160 and call center 170.

Client, personal or user computer 150 includes a computer usable medium to execute Internet browser and Internet-access computer programs for sending and receiving data over land network 144 and optionally, wired or wireless communication networks 142 to web-hosting portal 160. Personal or client computer 150 sends user preferences to web-hosting portal through a web-page interface using communication standards such as hypertext transport protocol (HTTP), and transport-control protocol and Internet protocol (TCP/IP). In one embodiment, the data includes directives to change certain programming and operational modes of electronic and mechanical systems within MVCU 110. In operation, a client utilizes computer 150 to initiate setting or re-setting of user-preferences for MVCU 110. User-preference data from client-side software is transmitted to server-side software of web-hosting portal 160. User-preference data is stored at web-hosting portal 160.

Web-hosting portal 160 includes one or more data modems 162, one or more web servers 164, one or more databases 166, and a network system 168. Web-hosting portal 160 is connected directly by wire to call center 170, or connected by phone lines to land network 144, which is connected to call center 170. In an example, web-hosting portal 160 is connected to call center 170 utilizing an IP network. In this example, both components, web-hosting portal 160 and call center 170, are connected to land network 144 utilizing the IP network. In another example, web-hosting portal 160 is connected to land network 144 by one or more data modems 162. Land network 144 sends digital data to and from modem 162, data that is then transferred to web server 164. Modem 162 may reside inside web server 164. Land network 144 transmits data communications between web-hosting portal 160 and call center 170.

Web server 164 receives user-preference data from user computer 150 via land network 144. In alternative embodiments, computer 150 includes a wireless modem to send data to web-hosting portal 160 through a wireless communication network 142 and a land network 144. Data is received by land network 144 and sent to one or more web servers 164. In one embodiment, web server 164 is implemented as any suitable hardware and software capable of providing web services to help change and transmit personal preference settings from a client at computer 150 to telematics unit 120 in MVCU 110. Web server 164 sends to or receives from one or more databases 166 data transmissions via network system 168. Web server 164 includes computer applications and files for managing and storing personalization settings supplied by the client, such as door lock/unlock behavior, radio station preset selections, climate controls, custom button configurations and theft alarm settings. For each client, the web server potentially stores hundreds of preferences for wireless vehicle communication, networking, maintenance and diagnostic services for a mobile vehicle.

In one embodiment, one or more web servers 164 are networked via network system 168 to distribute user-preference data among its network components such as database 166. In an example, database 166 is a part of or a separate computer from web server 164. Web server 164 sends data transmissions with user preferences to call center 170 through land network 144.

Call center 170 is a location where many calls are received and serviced at the same time, or where many calls are sent at the same time. In one embodiment, the call center is a telematics call center, facilitating communications to and from telematics unit 120 in MVCU 110. In an example, the call center is a voice call center, providing verbal communications between an advisor in the call center and a subscriber in a mobile vehicle. In another example, the call center contains each of these functions. In other embodiments, call center 170 and web-hosting portal 160 are located in the same or different facilities.

Call center 170 contains one or more voice and data switches 172, one or more communication services managers 174, one or more communication services databases 176, one or more communication services advisors 178, and one or more network systems 180.

Switch 172 of call center 170 connects to land network 144. Switch 172 transmits voice or data transmissions from call center 170, and receives voice or data transmissions from telematics unit 120 in MVCU 110 through wireless carrier system 140, communication network 142, and land network 144. Switch 172 receives data transmissions from and sends data transmissions to one or more web-hosting portals 160. Switch 172 receives data transmissions from or sends data transmissions to one or more communication services managers 174 via one or more network systems 180.

Communication services manager 174 is any suitable hardware and software capable of providing requested communication services to telematics unit 120 in MVCU 110. Communication services manager 174 sends to or receives from one or more communication services databases 176 data transmissions via network system 180. Communication services manager 174 sends to or receives from one or more communication services advisors 178 data transmissions via network system 180. Communication services database 176 sends to or receives from communication services advisor 178 data transmissions via network system 180. Communication services advisor 178 receives from or sends to switch 172 voice or data transmissions.

Communication services manager 174 provides one or more of a variety of services, including enrollment services, navigation assistance, directory assistance, roadside assistance, business or residential assistance, information services assistance, emergency assistance, and communications assistance. Communication services manager 174 receives service-preference requests for a variety of services from the client via computer 150, web-hosting portal 160, and land network 144. Communication services manager 174 transmits user-preference and other data to telematics unit 120 in MVCU 110 through wireless carrier system 140, communication network 142, land network 144, voice and data switch 172, and network system 180. Communication services manager 174 stores or retrieves data and information from communication services database 176. Communication services manager 174 may provide requested information to communication services advisor 178.

In one embodiment, communication services advisor 178 is implemented as a real advisor. In an example, a real advisor is a human being in verbal communication with a user or subscriber (e.g. a client) in MVCU 110 via telematics unit 120. In another embodiment, communication services advisor 178 is implemented as a virtual advisor. In an example, a virtual advisor is implemented as a synthesized voice interface responding to requests from telematics unit 120 in MVCU 110.

Communication services advisor 178 provides services to telematics unit 120 in MVCU 110. Services provided by communication services advisor 178 include enrollment services, navigation assistance, real-time traffic advisories, directory assistance, roadside assistance, business or residential assistance, information services assistance, emergency assistance, and communications assistance. Communication services advisor 178 communicate with telematics unit 120 in MVCU 110 through wireless carrier system 140, communication network 142, and land network 144 using voice transmissions, or through communication services manager 174 and switch 172 using data transmissions. Switch 172 selects between voice transmissions and data transmissions.

The call center 170 communicates with a vehicle service department 182. Vehicle service department 182 provides service and maintenance for MVCUs 110. When diagnostic trouble codes are received for an MVCU 110 the trouble codes are, in one embodiment, transmitted to the service department 182. Communication between call center 170 may be direct or indirect through network 144.

Vehicle analysis engine 190 includes one or more data modems 192, one or more web servers 194, one or more databases 196, and a network system 198. Vehicle analysis engine 190 communicates with call center 170. In one embodiment, vehicle analysis engine 190 is connected directly by wire to call center 170. In another embodiment, vehicle analysis engine 190 is connected by phone lines to land network 144. In an example, vehicle analysis engine 190 is connected to call center 170 utilizing an IP network. In this example, vehicle analysis engine 190 and call center 170 are connected to land network 144 utilizing the IP network. In another example, vehicle analysis engine 190 is connected to land network 144 by one or more data modems 192. Land network 144 sends digital data to and from modem 162, data that is then transferred to web server 194. Modem 192 is in communication with web server 194. Land network 144 transmits data communications between vehicle analysis engine 190 and call center 170. The vehicle analysis engine 190 may include one or more computers. The vehicle analysis engine 190 develops statistical data pools and corresponding algorithms in response to received data from at least one MVCU 110. Vehicle analysis engine 190 is configured to analyze data received from a plurality of vehicles. Vehicle analysis engine 190 creates, in one embodiment, modified algorithms in response to the analyzed data using statistical modeling.

Figure 2:
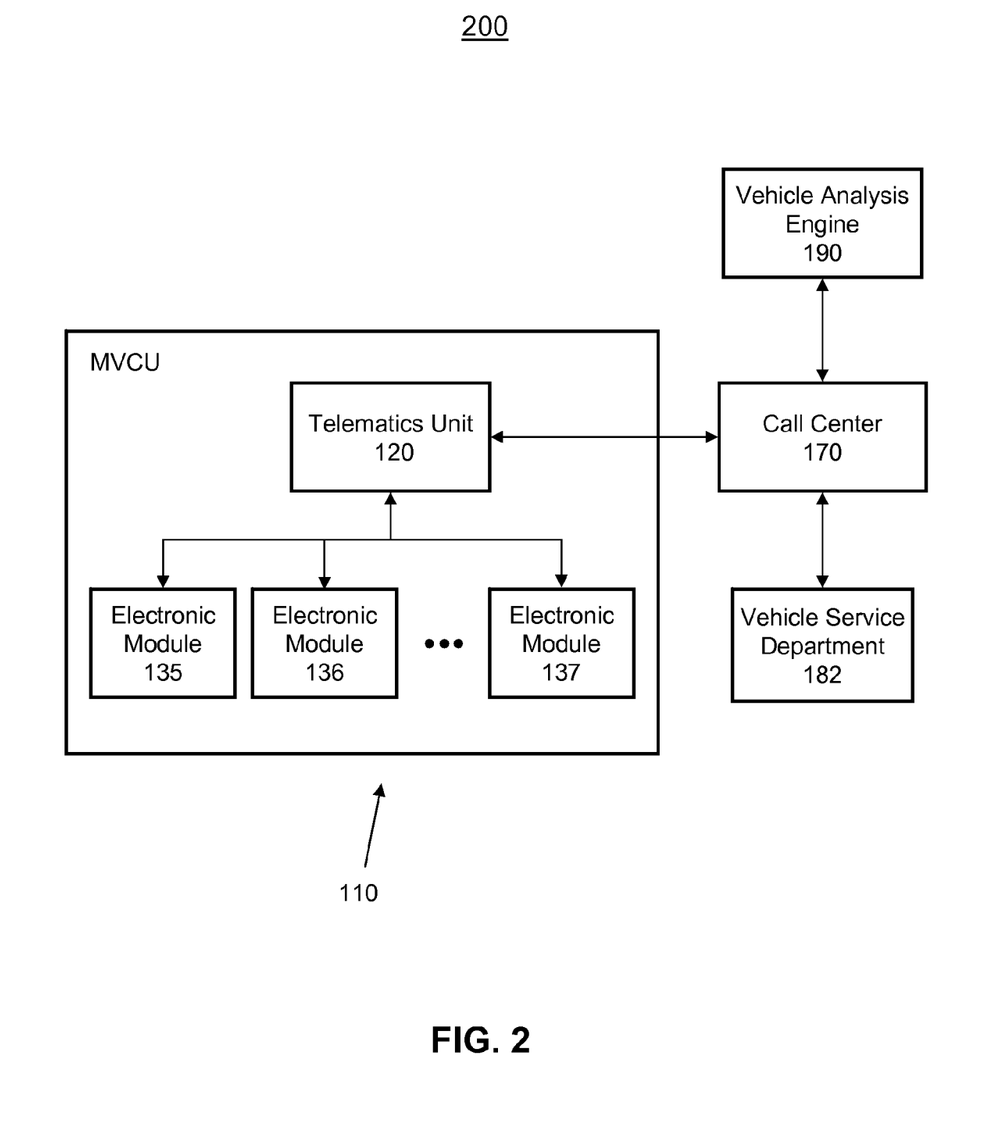
FIG. 2 is a schematic diagram of one embodiment of transmission paths for the monitored electronic module data and trigger event status indicators.

FIG. 2 is a schematic diagram 200 of one embodiment of transmission paths for the monitored electronic module data in the MVCS 100 in accordance with one aspect of the invention. The monitoring transmission paths are shown between the telematics unit 120, the call center 170, vehicle analysis engine 190 and vehicle service department 182. A plurality of electronic modules 135, 136 and 137 transmit electronic module data to the telematics unit 120.

The electronic modules 135, 136 and 137 each include many diagnostics packet identification numbers (DPIDs), which are predefined parameters that translate to specific memory locations in the electronic modules 135, 136 and 137. The telematics unit 120 is configured to request electronic module data from the electronic modules 135, 136 and 137 on a periodic or event triggered basis. The telematics unit 120 applies algorithms on the received electronic module data and, based on the output of the algorithm, forms a trigger event status indicator, which is transmitted to the call center 170. The call center 170 transmits the received trigger event status indicator to the vehicle analysis engine 190 and/or the vehicle service department 182. The vehicle analysis engine 190 transmits modified algorithms to the call center 170 based on the received trigger event status indicator. The call center 170 then transmits the modified algorithm to the telematics unit 120 to configure the telematics unit 120. The methods of determining when a data transmission is required are described below with reference to flowcharts 300, 400 and 500 in FIGS. 3, 4 and 5, respectively.

In one embodiment, triggers are activated in response to readings from a sensor. A sensor may sense activity on the vehicle bus, or the sensor may sense external or internal conditions of the vehicle. In another embodiment, the sensor senses activity in a specific vehicle module.

The data is transmitted between the telematics unit 120 and the call center 170 over one or more wireless carrier systems 140, one or more communication networks 142, one or more land networks 144. The data is transmitted between the call center 170, the vehicle analysis engine 190 and the vehicle service department 182 over one or more wireless carrier systems 140, one or more communication networks 142, one or more land networks 144, one or more client, personal or user computers 150, one or more web-hosting portals 160. The data is transmitted between the telematics unit 120 and the electronic modules 135, 136 and 137 over the vehicle communication network 112.

Figure 3:
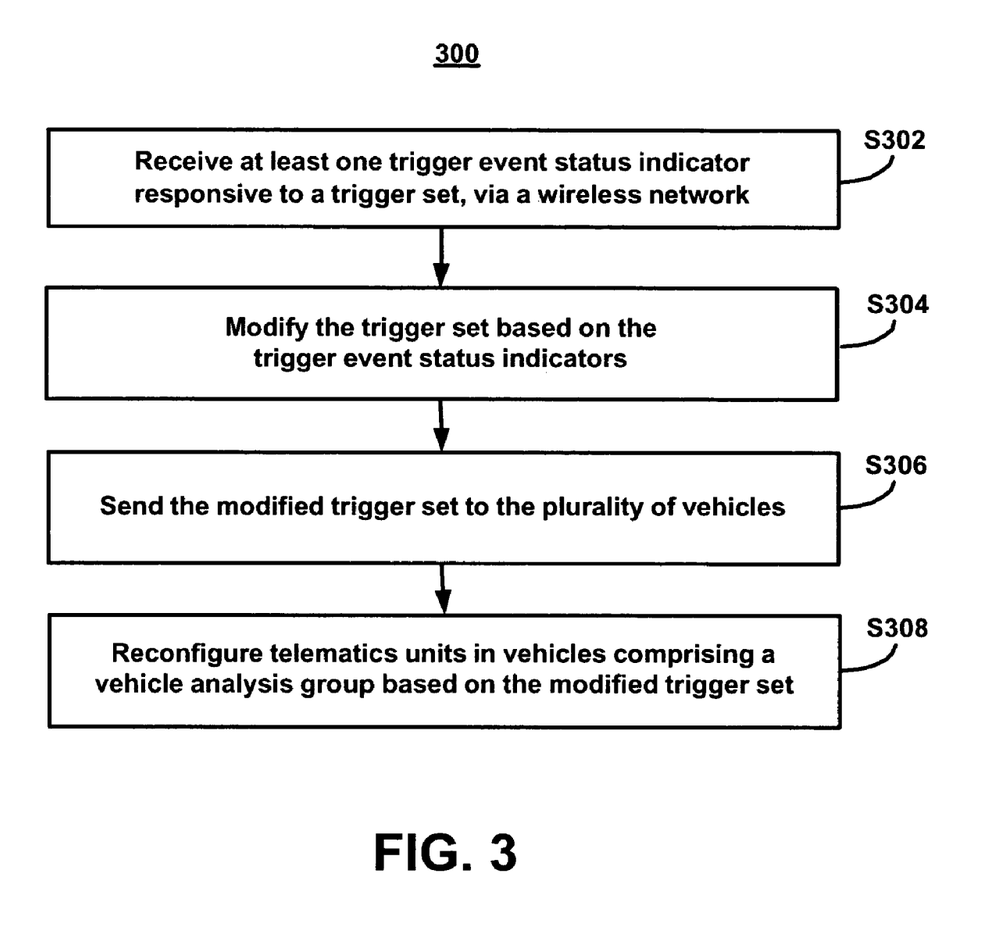
FIG. 3 illustrates a flowchart representative of a first embodiment of a method of monitoring electronic module data in accordance with the present invention.

FIG. 3 illustrates a flowchart 300 representative of a first embodiment of a method of monitoring electronic module data in accordance with the present invention. During stage S302, vehicle analysis engine 190 receives at least one trigger event status indicator responsive to a trigger set, via a wireless network from the telematics unit 120 through the call center 170.

The trigger set includes trigger points and algorithms operable based on preset interval data to determine relative conditions of the electronic module data. The electronic module data trigger the trigger set when at least one relative condition exceeds at least one trigger point. In one embodiment, at least one algorithm is a Boolean operation. For example, Boolean trigger relationships comprise AND, OR, NOT, NOR, NAND operators between triggers resulting in a trigger event produced by the Boolean relationship. Preset interval data is defined as any data relating to an interval between trigger events. For example, a preset interval data for a mileage trigger is one mile or 3000 miles. In another example, a preset interval data for a time-based trigger is one second or one month.

A trigger point is any event that has been predetermined to result in taking of predetermined actions. For example, a trigger point may be traveling a certain distance, a specified passage of time, a certain number of ignition cycles, a predetermined GPS-determined location, or the setting of a diagnostic trouble code (DTC).

The electronic module data include, but are not limited to, module identification data, data packet identification values, threshold data, maximum values, minimum values, rate of increase values, and rate of decrease values.

The relative conditions include, but are not limited to, storage triggering conditions, transfer triggering conditions, over-maximum conditions, under-minimum conditions, within-a-range conditions, over threshold conditions, excessive rate of increase conditions, excessive rate of decrease conditions, insufficient rate of increase conditions, insufficient rate of decrease conditions and combinations thereof.

During stage S304, the vehicle analysis engine 190 and call center 170 modify the trigger set based on the trigger event status indicators. The vehicle analysis engine 190 generates new algorithms based on the trigger event status indicators and the call center 170 includes the new algorithms in the trigger set. An exemplary method of modifying the trigger set based on the trigger event status indicators is described below with reference to flowchart 500 in FIG. 5.

During stage S306, the call center 170 sends the modified trigger set to the plurality of MVCUs 110 in a vehicle analysis group.

The vehicle analysis group is a group of MCVUs 110 including, but not limited to, one vehicle model, more than one vehicle model, one year of one vehicle model, multiple years of vehicle model, multiple years of more than one vehicle model, test fleet vehicles, specified analysis group vehicles, and all vehicles enrolled in the MVCS 100.

The MVCUs 110 in the vehicle analysis group each have the same trigger set and the same electronic modules 135, 136 and 137. In one embodiment, the MVCUs 110 in the vehicle analysis group each have some of the same electronics modules 135, 136 and/or 137 and each have the same portions of a trigger set relevant to the shared electronics modules 135, 136 and/or 137.

During stage S308, telematics units 120 in MVCUs 110 included in the vehicle analysis group are reconfigured based on the modified trigger set. The computer readable medium in the modified trigger set is configured with computer readable code for the algorithms and for the trigger points of the trigger set. The code is operable to modify the hardware of the telematics units 120 in the MVCUs 110 included in the vehicle analysis group, which receives the modified trigger set. The modified configuration of the telematics unit 120 is operable to request electronic module data from the electronic modules 135-137 at the modified intervals and/or modified event-based times indicated by the modified trigger set.

Figure 4:
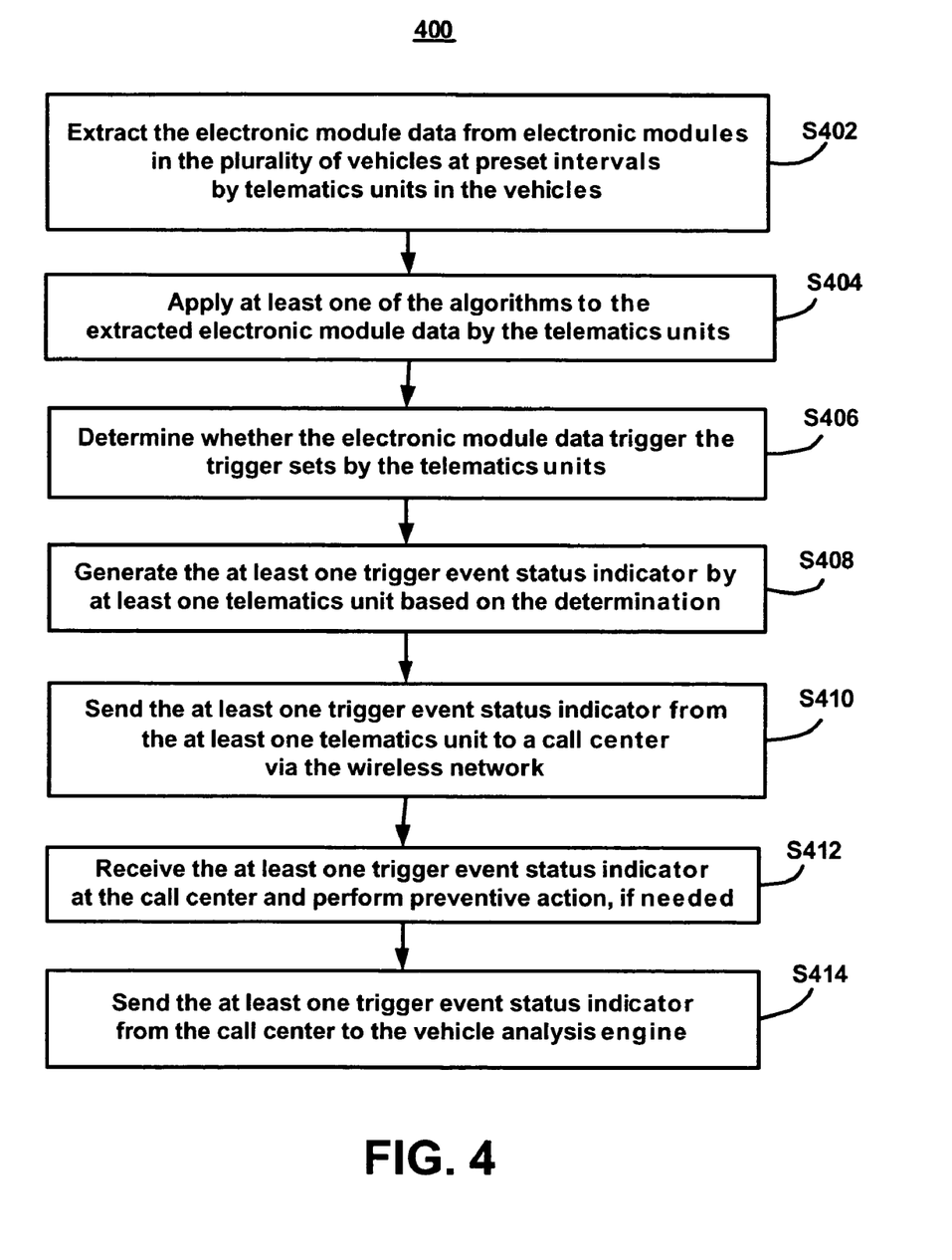
FIG. 4 illustrates a flowchart representative of a first embodiment of a method of receiving a trigger event status indicator in accordance with the present invention.

FIG. 4 illustrates a flowchart 400 representative of a first embodiment of a method of receiving a trigger event status indicator in accordance with the present invention. During stage S402, the telematics unit 120 in the plurality of MVCUs 110 extract electronic module data from electronic modules 135-137 in the plurality of MVCUs 110 at preset intervals based on the configuring of the telematics unit 120 by the trigger set. The preset intervals include time-based intervals and event-based intervals.

During stage S404, the telematics units 120 apply at least one of the algorithms to the extracted electronic module data. The algorithms determine the relative conditions between the various electronic module data, which can trigger at least one of the triggers. The relative conditions were described above with reference to stage S302 in flowchart 300 of FIG. 3. In one embodiment, the triggers include an electronic module datum being greater than or less than a preset trigger point. In other embodiments, triggers include a rate of change of an electronic module data set being greater than or less than a rate of change of another electronic module data set. Other triggers include a rate of change of an electronic module data set being greater than or less than a set trigger point. The algorithms are operable to make such relative value determinations.

During stage S406, the telematics units 120 determine whether the electronic module data trigger the trigger sets. The electronic module data trigger the trigger when at least one relative condition exceeds at least one preset trigger point.

During stage S408, at least one telematics unit 120 generates the at least one trigger event status indicator based on the determination made during stage S406. If at least one relative condition exceeds at least one preset trigger point a trigger event status indicator is generated. The trigger event status indicator indicates the status of the MVCU 110 based on the trigger. In one embodiment, the trigger event status indicator includes one or more vehicle status indicators, such as, "Problem with L anticipated," or "Watch level of M," or "Reduce level of N." In another embodiment, the trigger event status indicator includes at least one action indicator, such as, "Change oil," or "Clean oil filter," or "Check brake disks." In another embodiment, the trigger event status indicator includes at least one vehicle status indicator and at least one action indicator. If it is determined that the electronic module data did not trigger the trigger set during stage S406, a trigger event status indicator is not generated or a "No problem," trigger event status indicator is generated.

During stage S410, the telematics unit 120 sends a trigger event status indicator generated during stage S408 to the call center 170 via the wireless network. The telematics unit 120 sends a trigger event status indicator from the telematics unit 120 to the call center 170 via one or more wireless carrier systems 140, one or more communication networks 142, or one or more land networks 144.

During stage S412, the call center 170 receives the at least one trigger event status indicator and performs preventative action, if needed. If the trigger event status indicator indicates a potential problem is avoidable by preventative action, the call center 170 performs the preventative action. In one embodiment, preventative action includes calling the user of the MVCU 110 and suggesting a service visit or recommending preventative maintenance that the user can take.

In one embodiment, the call center 170 sends the trigger event status indicator to a vehicle service department 182. This option is taken when the trigger event status indicator indicates that there is some potential vehicular problem developing. In that case, the vehicle service department 182 receives a trigger event status indicator, which indicates the potential problem developing. The personnel in the vehicle service department 182 determine a preventative course of action. In one embodiment, the preventative action may include a call to the user of the MVCU 110 to set up a service visit. In another embodiment, the preventative action may include adjusting a preset trigger point in the trigger set. In this case, the vehicle service department 182 transmits the new preset trigger point to the call center 170 and the trigger set is modified by the call center 170. Then the telematics unit 120 is reconfigured by the modified trigger set.

During stage S414, the call center 170 sends the trigger event status indicator to the vehicle analysis engine 190. The call center 170 transmits the trigger event status indicator to the vehicle analysis engine 190 via one or more wireless carrier systems 140, one or more communication networks 142, one or more land networks 144, one or more client, personal or user computers 150, and/or one or more web-hosting portals.

Figure 5:
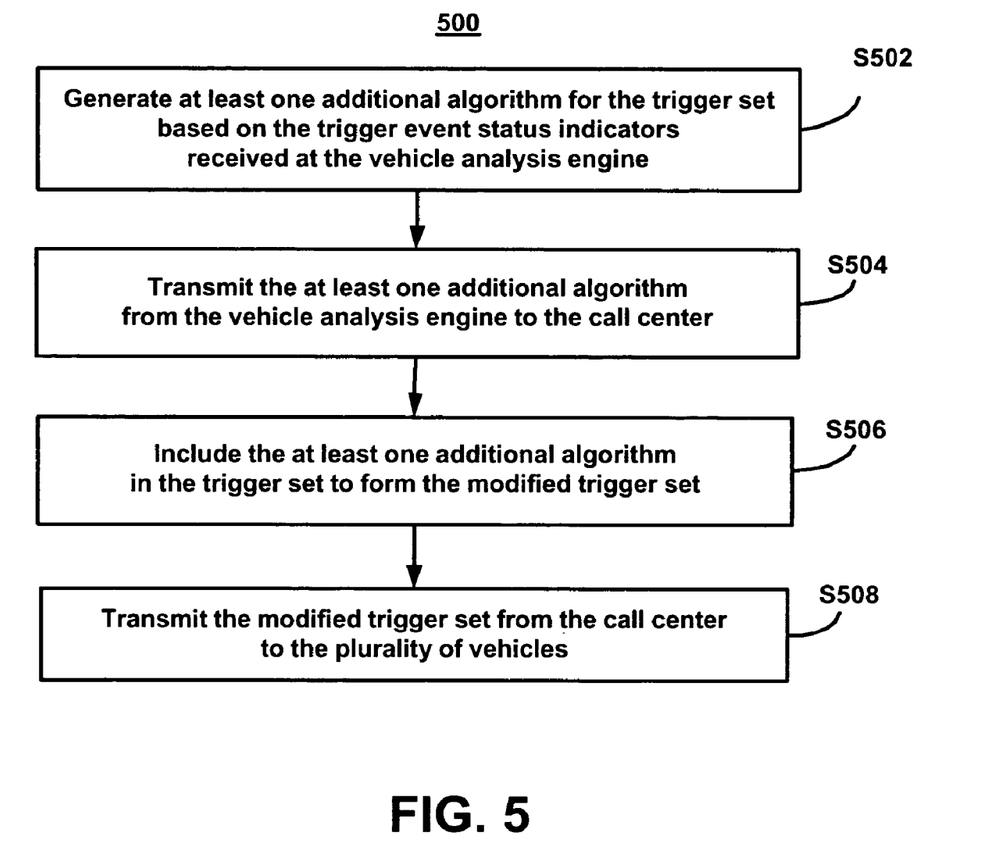
FIG. 5 illustrates a flowchart representative of a first embodiment of a method of modifying a trigger set in accordance with the present invention.

FIG. 5 illustrates a flowchart 500 representative of a first embodiment of a method of modifying a trigger set in accordance with the present invention.

During stage S502, the vehicle analysis engine 190 generates at least one additional algorithm for the trigger set based on the trigger event status indicators received from the call center 170. In one embodiment, the vehicle analysis engine 190 modifies or generates at least one trigger point. The vehicle analysis engine 190 analyzes data from multiple MVCUs 110 in at least one vehicle analysis group associated with the trigger set. The vehicle analysis engine 190 develops statistical data based on the trigger event status indicators from the MVCUs 110 in the same vehicle analysis group and determines if a trigger set for that vehicle analysis group requires modification. The statistical data includes trigger event status indicators from MVCUs 110 in the same vehicle analysis group collected over time.

In response to data trends and other data inputs, vehicle analysis engine 190 correlates trends and diagnosed troubles for the MVCU 110 in each vehicle analysis group to generate new algorithms or to modify legacy algorithms. Trend correlation is determined using algorithms and statistical analysis of the received data, as known to those of ordinary skill in the art. In one embodiment, vehicle analysis engine 190 communicates with, or provides data to, engineers and/or equipment used by the engineers in a vehicle engineering department of a car design and/or manufacturing company.

During stage S504, the vehicle analysis engine 190 transmits at least one additional algorithm to the call center 170. The vehicle analysis engine 190 transmits the additional algorithm via one or more wireless carrier systems 140, one or more communication networks 142, one or more land networks 144, one or more client, personal or user computers 150, and/or one or more web-hosting portals. In one embodiment, the vehicle analysis engine 190 transmits at least one modified trigger point to the call center 170.

During stage S506, the center 170 includes the at least one additional algorithm in the trigger set to form the modified trigger set after the call center 170 receives the at least one additional algorithm from the vehicle analysis engine 190. The call center 170 adds the new algorithm to the trigger set or removes a legacy algorithm and replaces it with the new algorithm. In one embodiment, the call center 170 adds the new trigger point to the trigger set or removes a legacy trigger point and replaces it with the new trigger point to form the modified trigger set. In another embodiment, the call center 170 adds a new algorithm and a new trigger point to the trigger set or removes a legacy algorithm and legacy trigger point and replaces it with the new algorithm and new trigger point to form the modified trigger set.

During stage S508, the call center 170 transmits the modified trigger set from the call center 170 to the plurality of MVCUs 110 in the vehicle analysis group associated with the modified trigger set. The call center 170 sends the modified trigger set to the telematics units 120 of the vehicle analysis group via one or more wireless carrier systems 140, one or more communication networks 142, and/or one or more land networks 144. In one embodiment, a modified trigger set applies only to X-type vehicle models and the call center 170 transmits the modified trigger set to all X-type vehicle models within the MVCS 100. If the modified trigger set applies only to X-type vehicle models and Y-type vehicle models, the call center 170 transmits the modified trigger set to all X-type vehicle models and Y-type vehicle models within the MVCS 100. If the modified trigger set applies to all MVCU 110, the call center 170 transmits the modified trigger set to all the MVCUs 110 within the MVCS 100. All the MVCUs 110 that need the modified algorithm and/or modified trigger points receive the modified trigger set at the telematics unit 120.

As described above with reference to stage S308 of flowchart 300 in FIG. 3, the telematics units 120 in the MVCUs 110 that receive the modified trigger set are reconfigured by the modified trigger set.

In this manner the trigger set is dynamically updated as the databases for vehicle analysis groups grow and the vehicle analysis engine 190 recognizes new correlations between relative conditions of the electronic module data and determines improved algorithms and preset trigger points.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

What is claimed is:

1. A method of monitoring electronic module data in a mobile vehicle, the method comprising:
   receiving at least one trigger event status indicator responsive to a trigger set from at least one of a plurality of vehicles at a vehicle analysis engine, via a wireless network;
   modifying the trigger set based on the at least one trigger event status indicator; and
   sending the modified trigger set to the plurality of vehicles.

2. The method of claim 1, wherein the plurality of vehicles comprise a vehicle analysis group, and wherein the vehicle analysis group is selected from the group consisting of one vehicle model, more than one vehicle model, one year of vehicle model, multiple years of one vehicle model, multiple years of more than one vehicle model, test fleet vehicles, specified analysis group vehicles, and all vehicles enrolled in a telematics system.

3. The method of claim 2, further comprising:
   reconfiguring telematics units in the vehicles comprising the vehicle analysis group based on the modified trigger set.

4. The method of claim 1, wherein the trigger set comprises trigger points and algorithms operable based on preset interval data to determine relative conditions of the electronic module data, and wherein the electronic module data trigger the trigger set when at least one relative condition exceeds at least one trigger point.

5. The method of claim 4, wherein at least one algorithm is a Boolean operation.

6. The method of claim 4, wherein receiving at least one trigger event status indicator responsive to a trigger set from at least one of a plurality of vehicles comprises:
   extracting the electronic module data from electronic modules in the plurality of vehicles at preset intervals by telematics units in the vehicles;
   applying at least one of the algorithms to the extracted electronic module data by the telematics units;
   determining whether the electronic module data trigger the trigger sets by the telematics units;
   generating the at least one trigger event status indicator by at least one telematics unit based on the determination;
   sending the at least one trigger event status indicator from the at least one telematics unit to a call center via the wireless network;
   receiving the at least one trigger event status indicator at the call center; and
   sending the at least one trigger event status indicator from the call center to the vehicle analysis engine.

7. The method of claim 6, wherein receiving the at least one trigger event status indicator at the call center, comprises:
   performing preventative action.

8. The method of claim 6, wherein modifying the trigger set based on the trigger event status indicators comprises:
   generating at least one additional algorithm for the trigger set based on the trigger event status indicators received at the vehicle analysis engine;
   transmitting the at least one additional algorithm from the vehicle analysis engine to the call center; and
   including the at least one additional algorithm in the trigger set to form the modified trigger set.

9. The method of claim 8 wherein the sending the modified trigger set to the plurality of vehicles comprises:
   transmitting the modified trigger set from the call center to the plurality of vehicles.

10. The method of claim 3, wherein the electronic module data are selected from the group consisting of module identification data, threshold data, maximum values, minimum values, rate of increase values, rate of decrease values, data packet identification values and combinations thereof; and
    wherein the relative conditions are selected from the group consisting of storage triggering conditions, transfer triggering conditions, over-maximum conditions, under-minimum conditions, within-a-range conditions, over threshold conditions, excessive rate of increase conditions, excessive rate of decrease conditions, insufficient rate of increase conditions, insufficient rate of decrease conditions and combinations thereof.

11. A system to monitor electronic module data in a mobile vehicle:
    means to receive, via a wireless network, at least one trigger event status indicator responsive to a trigger set from at least one of a plurality of vehicles;
    means to modify the trigger set based on the at least one trigger event status indicator; and
    means to send the modified trigger set to the plurality of vehicles.

12. The system of claim 11, further comprising:
    means to reconfigure telematics units in vehicles comprising a vehicle analysis group based on the modified trigger set.

13. The system of claim 11, wherein the means to receive at least one trigger event status indicator responsive to a trigger set comprise:
    means to extract the electronic module data from electronic modules in the plurality of vehicles at preset intervals by telematics units in the vehicles;
    means to apply at least one of the algorithms to the extracted electronic module data by the telematics units;
    means to determine whether the electronic module data trigger the trigger sets by the telematics units;
    means to generate the at least one trigger event status indicator by at least one telematics unit based on the determination;
    means to send the at least one trigger event status indicator from the at least one telematics unit to a call center via the wireless network;
    means to receive the at least one trigger event status indicator at the call center; and
    means to send the at least one trigger event status indicator from the call center to the vehicle analysis engine.

14. The system of claim 13, wherein the means to modify the trigger set based on the trigger event status indicators comprise:
    means to generate at least one additional algorithm for the trigger set based on the trigger event status indicators received at the vehicle analysis engine;
    means to transmit the at least one additional algorithm from the vehicle analysis engine to the call center; and means to include the at least one additional algorithm in the trigger set to form the modified trigger set.

15. The system of claim 14, wherein the means to send the modified trigger set to the plurality of vehicles comprise:
    means to transmit the modified trigger set from the call center to the plurality of vehicles.

16. A computer readable medium storing a computer program comprising:
    computer readable code for receiving at least one trigger event status indicator responsive to a trigger set from at least one of a plurality of vehicles at a vehicle analysis engine, via a wireless network;
    computer readable code for modifying the trigger set based on the at least one trigger event status indicator; and
    computer readable code for sending the modified trigger set to the plurality of vehicles.

17. The medium of claim 16, farther comprising:
    computer readable code for reconfiguring telematics units in the vehicles comprising the vehicle analysis group based on the modified trigger set.

18. The medium of claim 16, wherein the computer readable code for receiving at least one trigger event status indicator responsive to a trigger set comprises:
    computer readable code for extracting the electronic module data from electronic modules in the plurality of vehicles at preset intervals by telematics units in the vehicles;
    computer readable code for applying at least one of the algorithms to the extracted electronic module data by the telematics units;
    computer readable code for determining whether the electronic module data trigger the trigger sets by the telematics units;
    computer readable code for generating at least one trigger event status indicator by at least one telematics unit based on the determination;
    computer readable code for sending the at least one trigger event status indicator from the at least one telematics unit to a call center via the wireless network;
    computer readable code for receiving the at least one trigger event status indicator at the call center; and
    computer readable code for sending the at least one trigger event status indicator from the call center to the vehicle analysis engine.

19. The medium of claim 18, wherein computer readable code for modifying the trigger set based on the trigger event status indicators comprises:
    computer readable code for generating at least one additional algorithm for the trigger set based on the trigger event status indicators received at the vehicle analysis engine; computer readable code for transmitting the at least one additional algorithm from the vehicle analysis engine to the call center; and
    computer readable code for including the at least one additional algorithm in the trigger set to form the modified trigger set.

20. The medium of claim 19, wherein computer readable code for sending the modified trigger set to the plurality of vehicles comprises:
    computer readable code for transmitting the modified trigger set from the call center to the plurality of vehicles.

* * * * *